(12) United States Patent
Perel et al.

(10) Patent No.: US 7,423,277 B2
(45) Date of Patent: Sep. 9, 2008

(54) ION BEAM MONITORING IN AN ION IMPLANTER USING AN IMAGING DEVICE

(75) Inventors: Alexander S. Perel, Danvers, MA (US); Phil J. Ring, Beverly, MA (US); Ronald A. Capodilupo, Beverly, MA (US); Michael A. Graf, Belmont, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 310 days.

(21) Appl. No.: 11/374,945

(22) Filed: Mar. 14, 2006

(65) Prior Publication Data
US 2008/0061250 A1 Mar. 13, 2008

(51) Int. Cl.
*H01J 37/317* (2006.01)
*H01J 49/10* (2006.01)

(52) U.S. Cl. .................. 250/492.21; 250/492.23; 250/396 R; 250/398; 250/423 R; 250/424

(58) Field of Classification Search ............ 250/492.21, 250/492.23, 396 R, 398, 423 R, 424
See application file for complete search history.

(56) References Cited

U.S. PATENT DOCUMENTS

| 4,739,177 A | 4/1988 | Borden |
| 5,076,692 A | 12/1991 | Neukermans et al. |
| 5,255,089 A | 10/1993 | Dybas et al. |
| 5,751,422 A | 5/1998 | Mitchell |
| 2007/0178678 A1* | 8/2007 | Hatem et al. ................ 438/513 |

* cited by examiner

*Primary Examiner*—Nikita Wells
(74) *Attorney, Agent, or Firm*—Eschweiler & Associates, LLC

(57) ABSTRACT

An image monitor system monitors characteristics of an ion beam employed in ion implantation. The monitored characteristics can include particle count, particle information, beam current intensity, beam shape, and the like. The system includes one or more image sensors that capture frames or images along a beam path of an ion beam. An image analyzer analyzes the captured frames to obtain measured characteristics. A controller determines adjustments or corrections according to the measured characteristics and desired beam characteristics.

27 Claims, 8 Drawing Sheets

ION BEAM MONITORING IN AN ION IMPLANTER USING AN IMAGING DEVICE

FIELD OF INVENTION

The present invention relates generally to semiconductor device fabrication and ion implantation, and more particularly, to monitoring characteristics of ion beams with imaging devices.

BACKGROUND OF THE INVENTION

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their energy.

An ion implantation system is a collection of sophisticated subsystems, each performing a specific action on the dopant ions. In one example, dopant elements, in gas or solid form, are introduced inside an ionization chamber and ionized by a suitable ionization process. In one example process, the chamber is maintained at a low pressure (vacuum). A filament or indirectly heated cathode is located within the chamber and is heated to the point where electrons are created from the cathode source. The negatively charged electrons are attracted to an oppositely charged anode also within the chamber. During the travel from the cathode to the anode, the electrons collide with the dopant source elements (e.g., molecules or atoms) and create a host of positively charged ions from the source gas material.

Generally, other positive ions are created in addition to desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field. The radius of the arc is dictated by the mass of individual ions, speed, and the strength of the magnetic field. An exit of the analyzer permits only one species of ions, the desired dopant ions, to exit the mass analyzer.

An acceleration system is employed to accelerate or decelerate the desired dopant ions to a predetermined momentum (e.g., mass of a dopant ion multiplied by its velocity) to penetrate the wafer surface. For acceleration, the system is generally of a linear design with annular powered electrodes along its axis. As the dopant ions enter therein, they are accelerated there through.

Subsequently, the accelerated ions within the beam are directed toward a target wafer or location. The ion beam strikes the target with an actual angle of incidence, which is typically measured in one or two dimensions from normal. This actual angle can vary from a desired or selected angle of implantation.

Operation of an ion implantation system or other ion beam equipment (e.g., linear accelerators) may result in the production of contaminant particles. These particles can result in a number of ways, such as ions striking photoresist coated surfaces, particles breaking off of components within the system, and the like. The contaminant particles can interfere with ion implantation processes and degrade and/or destroy semiconductor devices undergoing ion implantation. For example, particles can collide with and adhere to target wafers during ion implantation resulting in yield loss. As another example, the particles can become implanted impacting device operation.

As a result, semiconductor device manufactures may measure particles on semiconductor wafers after ion implantation. This measurement allows a determination or estimation of particles present within an ion beam during ion implantation. However, only a small fraction of the particles are measured and adjustments can only be performed after the ion implantation process has concluded.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the present invention facilitate ion implantation processes and systems by monitoring ion beam characteristics during ion implantation and permitting correction adjustment to the ion beam generation and formation in real time. Orthogonal or cross sectional images of the ion beam are obtained, typically at a selected frames per second, and subsequently analyzed to identify beam characteristics. These identified characteristics can then be compared with desired or expected characteristics. Deviations there from can result in corrective adjustments to move future measured characteristics to be toward the desired or expected characteristics.

In accordance with one aspect of the present invention, an image monitor system is provided. The image monitor system monitors characteristics of an ion beam employed in ion implantation. The monitored characteristics can include particle count, particle information, beam intensity, beam shape, and the like. The system includes one or more image sensors that capture sequential frames or images along a beam path of an ion beam. The image sensors, such as a camera, capture the frames or images along a beam path of the ion beam. An image analyzer analyzes the captured frames to obtain measured characteristics. A controller determines adjustments or corrections according to the measured characteristics and desired beam characteristics. Other systems, methods, and detectors are also disclosed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
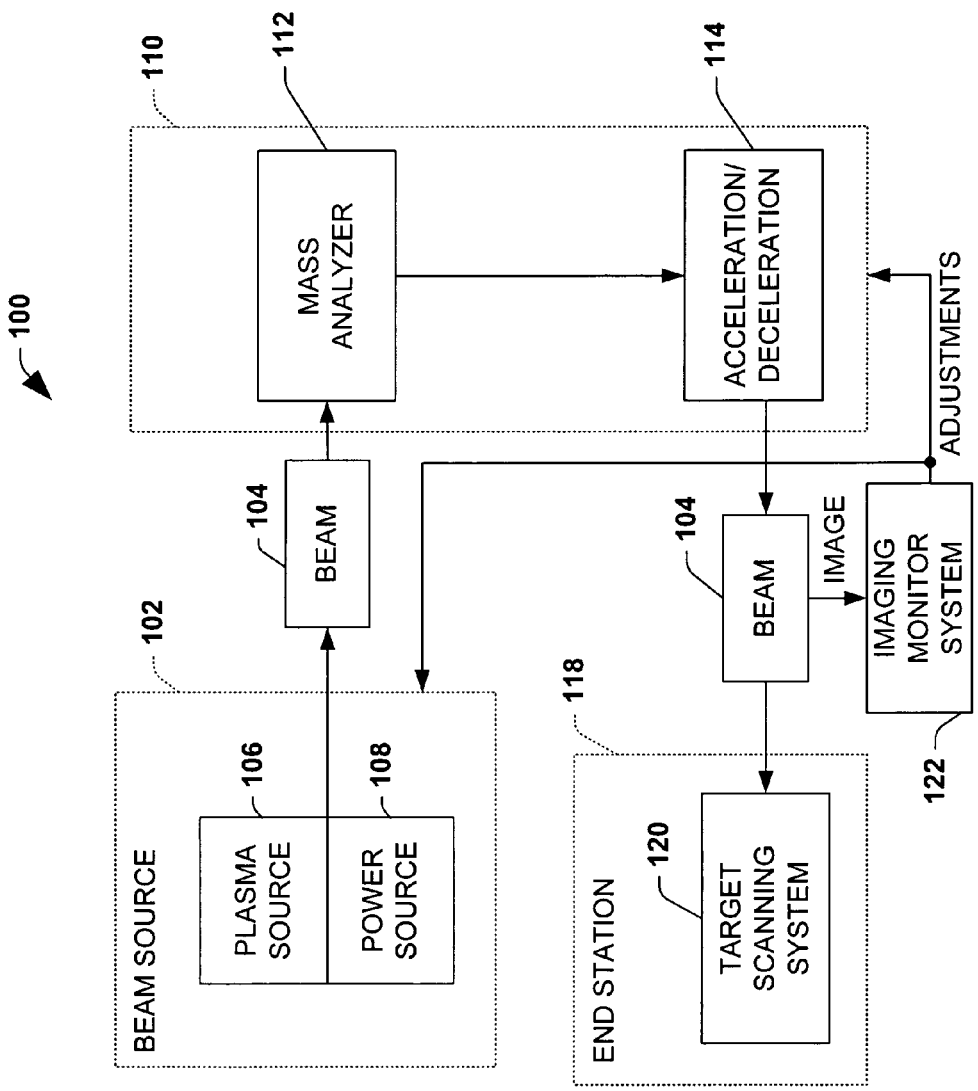
FIG. 1 is an ion implantation system suitable for implementing one or more aspects of the present invention in block diagram form.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

Aspects of the present invention facilitate ion implantation processes and systems by monitoring ion beam characteristics during ion implantation and permitting correction adjustment to the ion beam generation and formation in real time. Orthogonal or cross sectional images of the ion beam are obtained at various times and subsequently analyzed to identify beam characteristics. These identified characteristics can then be compared with desired or expected characteristics. Deviations there from can result in corrective adjustments to move future measured characteristics to be toward the desired or expected characteristics.

Referring initially to FIG. 1, an ion implantation system 100 suitable for implementing one or more aspects of the present invention is depicted in block diagram form. The system 100 includes an ion source 102 for producing an ion beam 104 along a beam path. The ion beam source 102 includes, for example, a plasma source 106 with an associated power source 108. The plasma source 106 may, for example, comprise an ionization chamber and extraction optics from which a focused and shaped ion beam is extracted.

A beam line assembly 110 is provided downstream of the ion source 102 to receive the beam 104 there from. The beam line assembly 110 includes a mass analyzer 112, an acceleration structure 114, which may include, for example, one or more gaps. The beam line assembly 110 is situated along the path to receive the beam 104. The mass analyzer 112 includes a field generating component, such as a magnet (not shown), and operates to provide a field across the beam path so as to deflect ions from the ion beam 104 at varying trajectories according to mass (e.g., mass-to-charge ratio). Ions traveling through the magnetic field experience a force which directs individual ions of a desired mass along the beam path and which deflects ions of undesired mass away from the beam path.

The acceleration gap or gaps within the acceleration structure 114 are operable to accelerate and/or decelerate ions within the beam to achieve a desired depth of implantation in a workpiece. Accordingly, it will be appreciated that while the terms accelerator and/or acceleration gap may be utilized herein in describing one or more aspects of the present invention, such terms are not intended to be construed narrowly so as to be limited to a literal interpretation of acceleration, but are to be construed broadly so as to include, among other things, deceleration as well as changes in direction. It will be further appreciated that acceleration/deceleration means may be applied before as well as after the magnetic analysis by the mass analyzer 112.

An end station 118 is also provided in the system 100 to ion beam 104 from the beamline assembly 110. The end station 118 supports one or more workpieces such as semiconductor wafers (not shown) along the beam path for implantation using the mass analyzed ion beam 104. The end station 118 includes a target scanning system 120 for translating or scanning one or more target workpieces and the ion beam 104 relative to one another. The target scanning system 120 may provide for batch or serial implantation, for example, as may be desired under given circumstances, operating parameters and/or objectives.

The system 100 also includes an imaging monitoring system 122 that captures images or frames of all or part of the ion beam 104 at one or more points along the path of the ion beam 104 and analyzes the captured frames to measure one or more aspects of the ion beam 104. The monitoring system 122 includes cameras and/or image sensing devices positioned at the one or more points. In one example, at least one of these image sensing devices are positioned downstream of the beamline assembly 110 in order to characterize the ion beam just prior to actual implantation. The image sensing devices obtain frames at suitable characteristics, including resolution, color depth, wavelength (e.g., visible and infra-red) and suitable frame rates, such as 30 fps, 60 fps, 1000 fps and the like.

It is appreciated that the imaging monitoring system 122 can also provide continuous image data from the cameras and/or image sensing devices instead of images or frames at discrete intervals. For example, the imaging monitoring system 122 can simply comprise one or more image sensors that continuously provide image information.

The monitoring system 122 analyzes the captured frames to identify or measure aspects of the ion beam 104. The measured aspects can include, for example, particle number, beam shape, flux or beam current intensity, beam stability, and the like. For particle measurement, as an example, the monitoring system 122 can detect lines or shapes of pixels above a threshold brightness in one or more frames and/or an increase above a threshold amount in one or more sensors and identify these as particles. For beam current intensity measurement, as another example, the monitoring system 122 can detect brightness levels of the beam current intensity wherein increased brightness or intensity is related to increased current. For beam stability, as yet another example, the monitoring system 122 can detect fluctuations or oscillations in brightness over multiple frames which may represent oscillations in beam current intensity.

The image monitoring system 122 can also provide corrective adjustments to the beam source 102 and/or the beamline assembly 110 according to the one or more measured aspects. These adjustments can alter or improve the ion beam 104 in real time without waiting until the current ion implant process has ended, or the implant process can be temporarily suspended while the adjustments are made, and then continued once the adjustments are satisfactorily completed.

Figure 2:
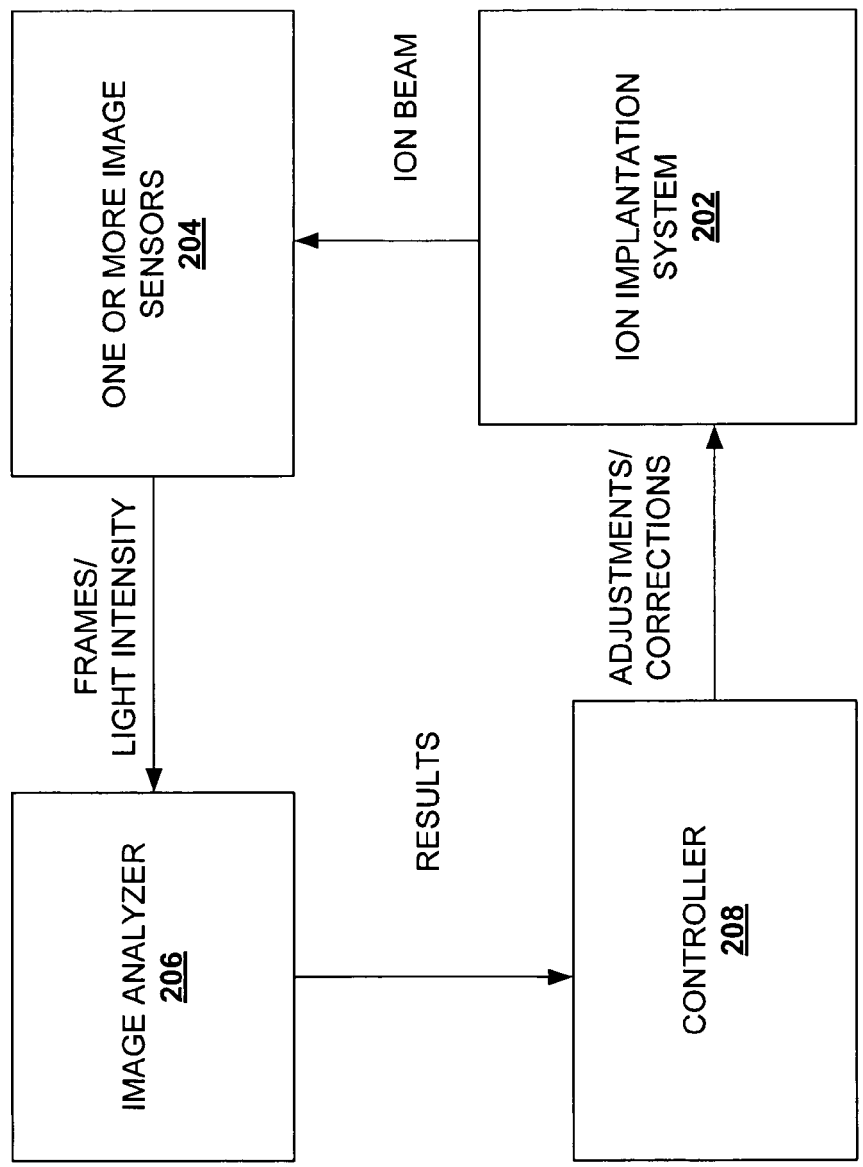
FIG. 2 is a block diagram illustrating an imaging monitor system in accordance with an aspect of the present invention.

FIG. 2 is a block diagram illustrating an imaging monitor system 200 in accordance with an aspect of the present invention. The system 200 can be employed to monitor one or more aspects of an ion beam during ion implantation. The system 200 captures frames or images of the ion beam from one or more locations or positions along a path of the ion beam.

From these frames, the system measures or characterizes the one or more aspects of the ion beam. After this characterization, adjustments to the generation and/or processing of the ion beam can be performed.

The system 200 includes one or more image sensors 204, an image analyzer 206, and a controller 208. The system 200 operations with an ion implantation system 202, which generates an ion beam suitable or employable for ion implantation. The ion implantation system 202 can be a single or batch wafer base system and includes an ion source, beamline assembly, end station, and the like. The ion implantation system 202 generates the ion beam according to a selected shape, beam current intensity, and energy.

The one or more image sensors 204 are located at positions along a beam path of the ion beam. The sensors 204 can be located, for example, immediately downstream of an ion source, within portions of the beamline assembly, downstream of the beamline assembly, within an end station, and the like. The sensors obtain frames or images at a selected resolution, which can vary for aspects of the invention. Alternately, the sensors can, for example, measure light intensity continuously and provide that measurement as continuous frames at an infinite frame rate. For example, the selected resolution can be 300 pixels by 200 pixels, 640 pixels by 480 pixels, and the like. In another example, the selected resolution is only a single pixel. The selected resolution can also have an aspect ratio, which can vary in aspects of the invention. In one example, the aspect ratio is such that a greater length of the ion beam is captured.

The one or more image sensors 204 capture the frames at a selected frame rate. The frame rate, in one example, is selected so as to facilitate identification of particles or contaminants traveling within the ion beam. Some examples of suitable frame rates that can be employed include, 30 fps, 60 fps, 1,000 fps, and the like.

The image analyzer 206 obtains the frames from the image sensors 204 and analyzes the frames to measure or characterize one or more aspects of the ion beam. The measured aspects can include, for example, particle content, shape, flux or beam current intensity, beam stability, and the like.

Particles are contaminants that enter the ion beam via a number of mechanisms, such as, ions striking photoresist coated surfaces, particles breaking off of components within the system, and the like. The particles can interfere with ion implantation processes and degrade and/or destroy semiconductor devices undergoing ion implantation. For example, particles can collide with and adhere to target wafers during ion implantation resulting in yield loss. As another example, the particles can become implanted, thus impacting device operation.

Particles are typically much larger than ions within a beam and tend to be brighter than other portions of the beam in which they are present. Thus, to measure particles, the image analyzer 206, in one example, identifies a segment or line of pixels having a brightness above a baseline value in a current frame. Identifying segments in such a manner mitigates false identifications from sources, such as surfaces simply reflecting light. This identified segment yields a starting point for a vector representing an identified particle. Subsequent frames can be analyzed for continuation of that particle and to provide trajectory and velocity with respect to identified segments and frame rates. Information about each identified particle can comprise the trajectory, speed/velocity, size, and the like. It is noted that in some aspects of the invention, only a count of particles is obtained.

For beam current intensity measurement, as another example, the image analyzer 206 can detect brightness levels of the beam current intensity wherein increased brightness or intensity is related to increased current. For beam stability, as yet another example, the image analyzer 206 can detect fluctuations or oscillations in brightness which may represent oscillations in beam current intensity.

The controller 208 obtains the measured or characterization results from the image analyzer 206. The results can relate to one or more aspects of the ion beam, as discussed above. The results, in one example, include a particle count over a selected period of time. In another example, the results include particle counts, particle vectors, and measured beam uniformity.

The controller 208 selects and/or determines corrective adjustments according to the received results. For example, the controller can tune source parameters within an ion source of the ion implantation system on particle counts above a threshold amount. As another example, particle counts above a threshold amount could result in adjusting extraction optics used in focusing and shaping the ion beam through a beamline assembly of the ion implantation system 202. For example, reducing the overall size of the ion beam can mitigate particle generation by reducing impact of ions with apertures and the like within the beamline assembly.

The controller 208 provides the corrective adjustments to the ion implantation system 202 so that deviations from desired beam characteristics can be reduced. In one example, the corrective adjustments are provided continuously during ion implantation. In another example, the corrective adjustments are provided periodically during ion implantation. In yet another example, the corrective adjustments are provided after an entire ion implantation process has been performed.

The controller 208 can also obtain measurements from other components not shown. For example, a faraday cup can provide measurements related to beam current intensity. Thus, if the image analyzer 206 provides a particle count, the controller can provide corrective adjustments according to the provided particle count from the image analyzer 206 and from beam current intensity measurements from the faraday cup.

Figure 3:
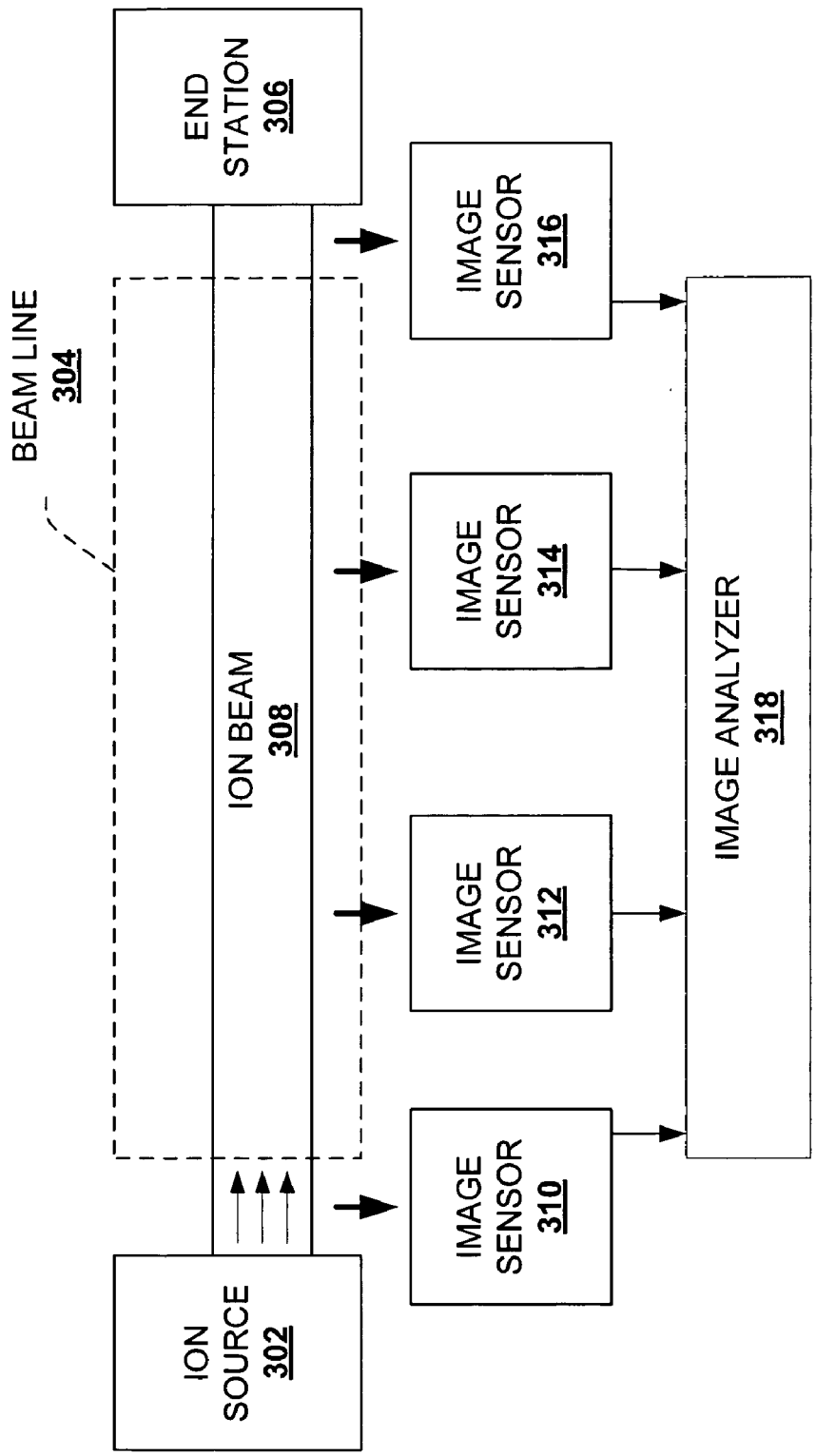
FIG. 3 is a block diagram illustrating a portion of an imaging monitor system in accordance with an aspect of the invention.

FIG. 3 is a block diagram illustrating a portion of an imaging monitor system in accordance with an aspect of the invention. This diagram is provided to illustrate one possible example of arranging image sensors of the imaging monitor system in accordance with an aspect of the present invention. This example is provided for illustrative purposes and is not intended to limit aspects of the invention to that which is depicted and described with respect to FIG. 3.

An ion implantation system is shown that comprises an ion source 302, a beamline assembly 304, and an end station 306. The ion source 302 produces an ion beam 308 along a beam path. It is noted that beam paths for such ion beams can have curves and/or bends along their path. The beam line assembly 304 is provided downstream of the ion source 302 to receive the beam there from. The beam line assembly 304 can includes a mass analyzer, an acceleration structure, and the like. The end station 306 supports one or more workpieces such as semiconductor wafers (not shown) along the beam path for implantation.

The imaging monitoring system includes a number of image sensors located at various locations along the path of the ion beam 308. A first image sensor 310 is located downstream of the ion source 302 and upstream of the beamline assembly 304. A second image sensor 312 is positioned within the beamline assembly 304 as shown. A third image sensor 314 is also positioned within the beam line assembly 304, but is downstream of the second image sensor 312. A further image sensor 316 is positioned downstream of the beamline assembly 304 and upstream of the end station 306.

An image analyzer 318, also a part of the image monitoring system, obtains captured frames from each of the image sensors and identifies or characterizes one or more aspects of the ion beam 308. For example, the image analyzer 318 can identify or estimate particle sources within the ion implantation system by comparing particle counts from the image sensors.

It is noted that the configuration shown in FIG. 3 is provided as an example and that other configurations, including less or more image sensors, are contemplated in accordance with aspects of the present invention.

FIGS. 4A to 4F illustrate an example of particle detection by image/frame capture and image analysis in accordance with an aspect of the present invention. The particle detection is performed over a set of captured frames and is provided merely as an example. An image sensor is positioned orthogonal to a path of an ion beam that, in this example, contains a particle.

Figure 4A:
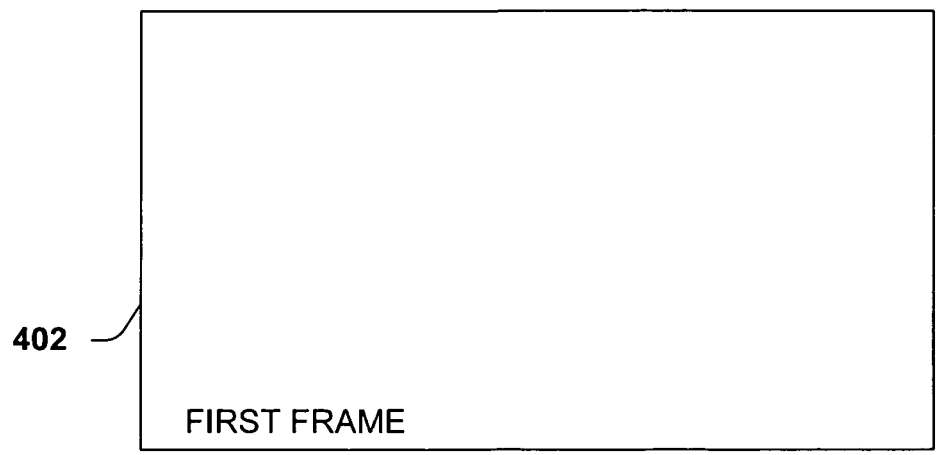
FIGS. 4A to 4F illustrate an example of particle detection by image/frame capture and image analysis in accordance with an aspect of the present invention.
Figure 4B:
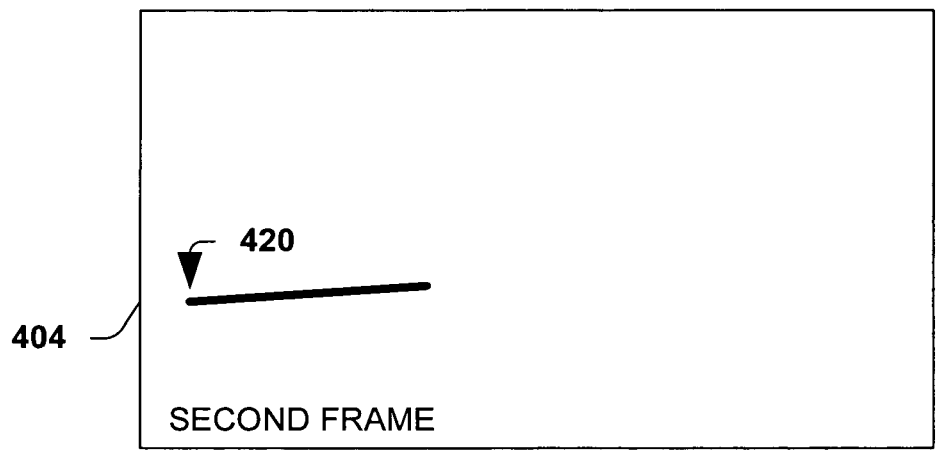
Figure 4C:
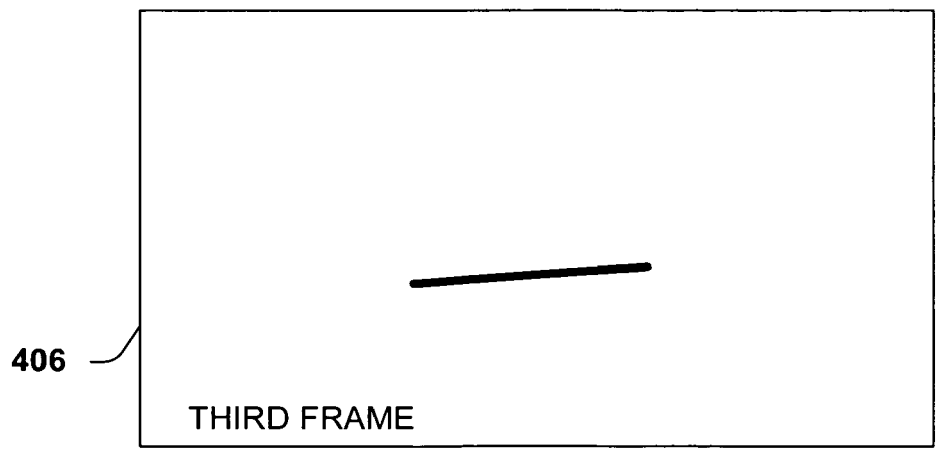
Figure 4D:
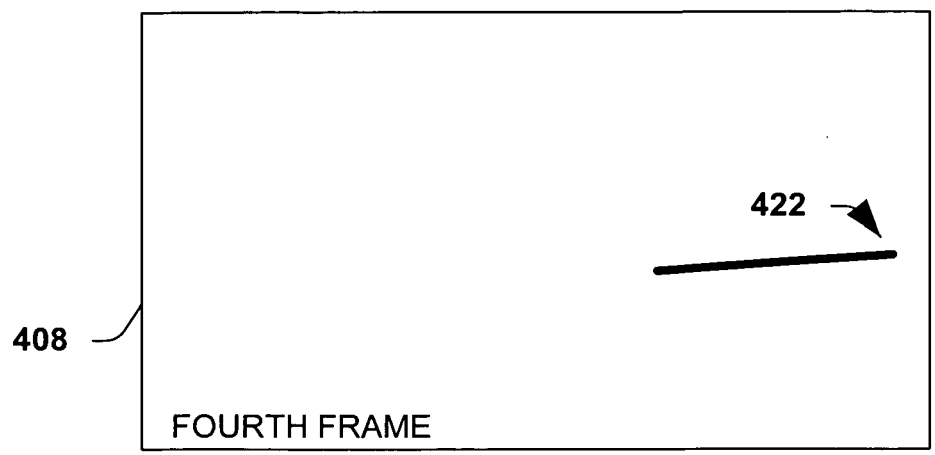
Figure 4E:
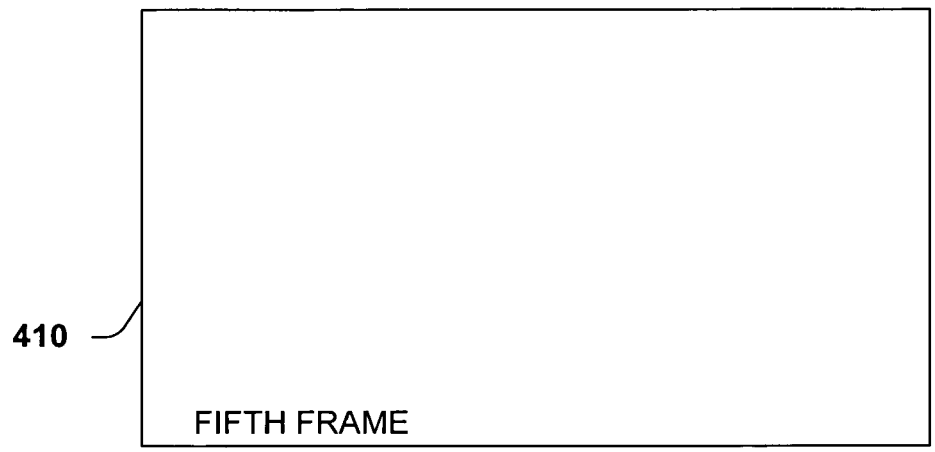

FIG. 4A is a view of a first frame 402 captured by the image sensor at a first time. It can be seen that no pixels within the frame can be identified as a particle. FIG. 4B is a view of a second frame 404 captured by the image sensor at a second time. Here, a segment is seen that has a starting point 420. FIG. 4C is a view of a third frame 406 captured at a third time. Another segment can be seen that has shifted downstream indicating movement of the particle. FIG. 4D is a view of a fourth frame 408 captured by the image sensor at a fourth time. Here, another segment is shown and has an ending point 422 of the segments. FIG. 4E is a view of a fifth frame 410 captured by the image sensor at a fifth time. In this view, a particle is not seen.

Figure 4F:
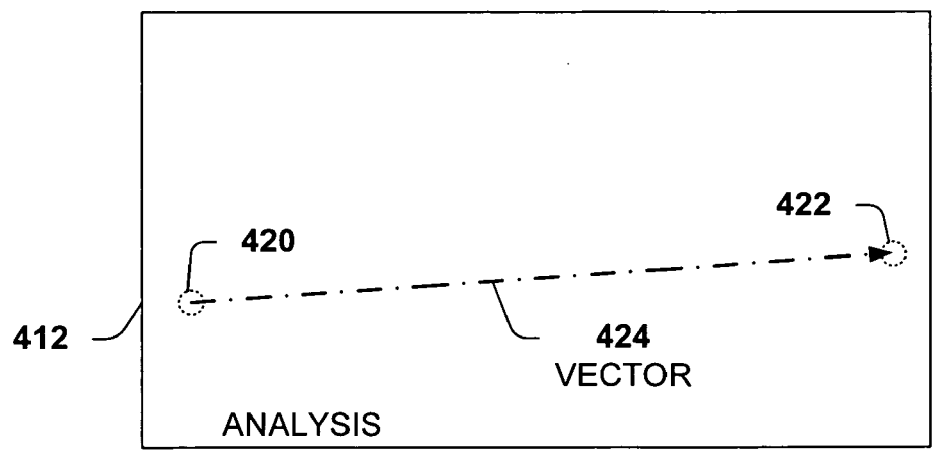

FIG. 4F is a graphical depiction of image analysis performed on the captured frames. The analysis identifies the starting point 420 of the particle and the ending point of the particle 422 from the frames 402, 404, 406, 408, and 410. The image analysis then establishes a vector 424 that represents a trajectory and velocity of the particle. The trajectory can be estimated or determined by the path from the starting point 420 to the ending point 422. It is noted that the particle is shown following a straight line, however, the present invention contemplates particles having curved paths and the like. The velocity can be determined from the starting point and start time and the ending point and ending time.

Figure 5:
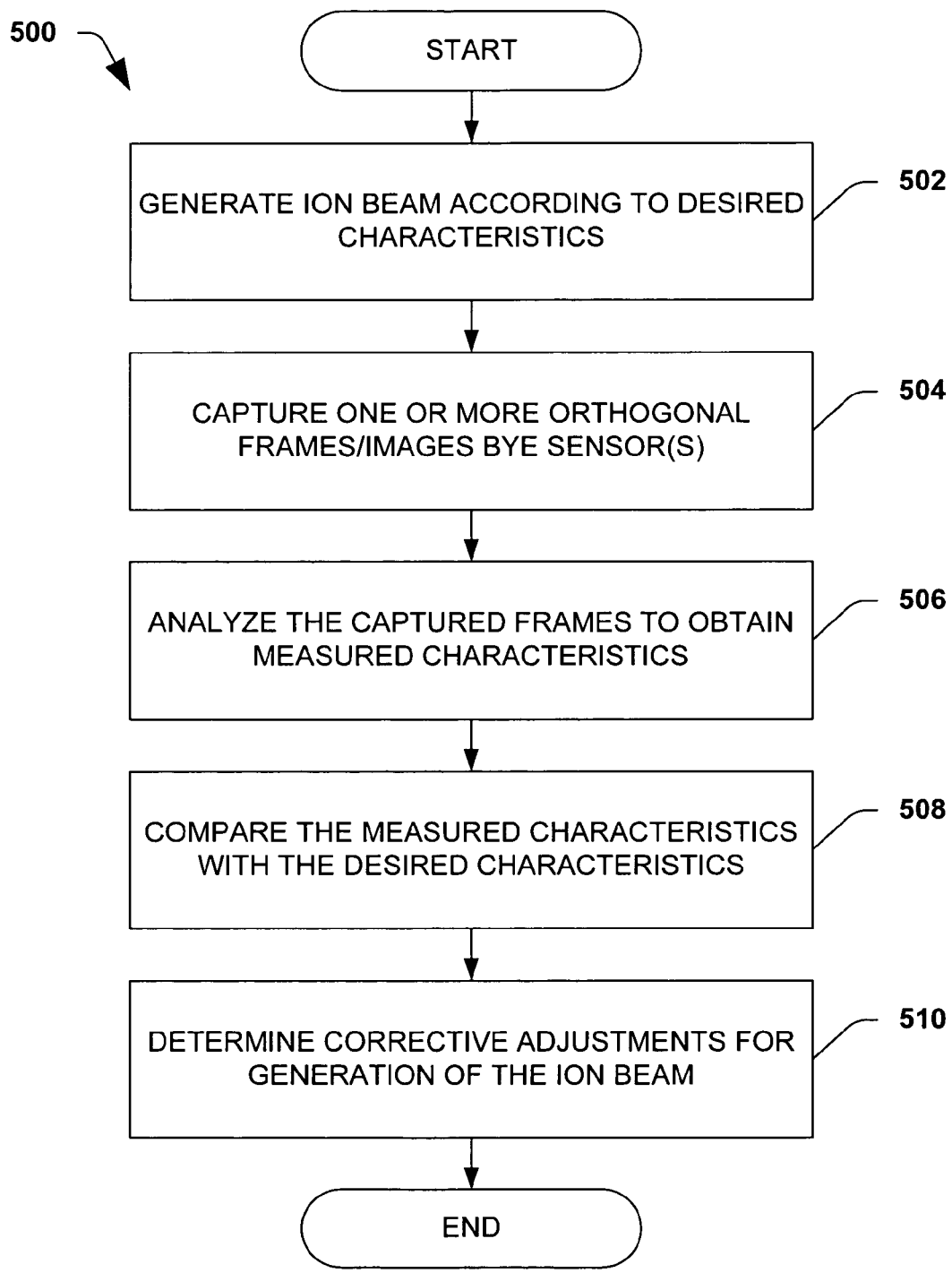
FIG. 5 is a flow diagram of a method of monitoring characteristics of an ion beam in accordance with an aspect of the present invention.

FIG. 5 is a flow diagram of a method 500 of monitoring characteristics of an ion beam in accordance with an aspect of the present invention. The method 500 can be performed to obtain these characteristics and, optionally, perform adjustments on ion beam generation and/or beam processing in accordance with the characteristics. The method 500 can be performed as part of a setup process and/or during ion implantation.

The method 500 begins at block 502, wherein an ion beam traveling along a path toward a target location is generated or provided according to one or more desired characteristics. The desired characteristics can include, for example, minimum particle count, desired beam current intensity, beam current intensity variations, and the like.

One or more orthogonal frames or images of the ion beam are captured at block 504. The frames are captured by one or more image sensors positioned along the path of the ion beam. The captured frames have a suitable resolution and frame rate that can vary according to implementation and characteristics being monitored. For example, a single pixel indicating brightness can be employed, in some instances, for particle detection. For another example, a 320 pixel by 200 pixel frame can be employed for monitoring beam characteristics such as intensity, size and shape. Examples of suitable frame rates employed are, 30 fps, 60 fps, 1000 fps, and the like. In some examples, higher frame rates can require higher resolutions for the frames in order to suitably monitor the monitored characteristics.

The captured frames are analyzed at block 506 to obtain measured characteristics of the ion beam. The measured characteristics can include, for example, particle count, beam intensity, beam intensity variations, and the like.

Particles are contaminants that enter the ion beam via a number of mechanisms, such as, ions striking photoresist coated surfaces, particles breaking off of components within the system, and the like. The particles can interfere with ion implantation processes and degrade and/or destroy semiconductor devices undergoing ion implantation.

Particles are typically larger than ions within a beam and tend to be brighter than other portions of the beam in which they are present. Thus, to measure particles, in one example, a segment or line of pixels having brightness above a baseline value in a current frame is identified. Identifying segments in such a manner mitigates false identifications from sources, such as surfaces simply reflecting light. This identified segment yields a starting point for a vector representing an identified particle. Subsequent frames can be analyzed for continuation of that particle and to provide trajectory and velocity with respect to identified segments and frame rates. Alternately, all such information can be obtained from a single frame. Information about each identified particle can comprise the trajectory, speed/velocity, size, and the like. It is noted that in some aspects of the invention, only a count of particles is obtained.

For beam current intensity measurement, as another example, brightness levels can be detected associated with the beam current intensity wherein increased brightness or intensity is related to increased current. For beam stability, as yet another example, fluctuations or oscillations in brightness can be detected which may represent oscillations in beam current intensity.

The measured characteristics are compared with the desired characteristics at block 508. The desired characteristics can include, for example, minimum particle count, acceptable range of beam current intensity, acceptable range of beam current intensity variations, and the like. For example, the minimum particle count could be just one or two during a certain time duration, such as a ten second period. For example, the maximum beam size could be some size suitably smaller, say at least several millimeters, than the closest aperture to the beam at the position where the images are being measured. For example, the tolerable beam stability may be for oscillations of amplitude smaller than say 1% of the nominal beam intensity and with a frequency that is not close (for example, at least 10% away) to any particular resonant frequencies of beam or workpiece scanning (for example, 3 Hz or 20 Hz).

If the measured characteristics differ from the desired characteristics, corrective adjustments are determined at block 510. For example, particle counts above a threshold/minimum amount could result in corrective adjustments such as tuning source parameters within an ion source. As another example, particle counts above a threshold amount could result in adjusting extraction optics used in focusing and shaping the ion beam through a beam line assembly. As another example, reducing the overall size of the ion beam can mitigate particle generation by reducing impact of ions with apertures and the like within the beam line assembly. If the beam current intensity is below a minimum amount, current can be increased.

It is appreciated that the method 500, as well as variations thereof, can be further appreciated with reference to other figures of the present invention. Additionally, the method 500 and description thereof can also be employed to facilitate a better understanding of other aspects of the invention described above.

While, for purposes of simplicity of explanation, the method 500 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features or blocks may be required to implement a methodology in accordance with an aspect the present invention.

Figure 6:
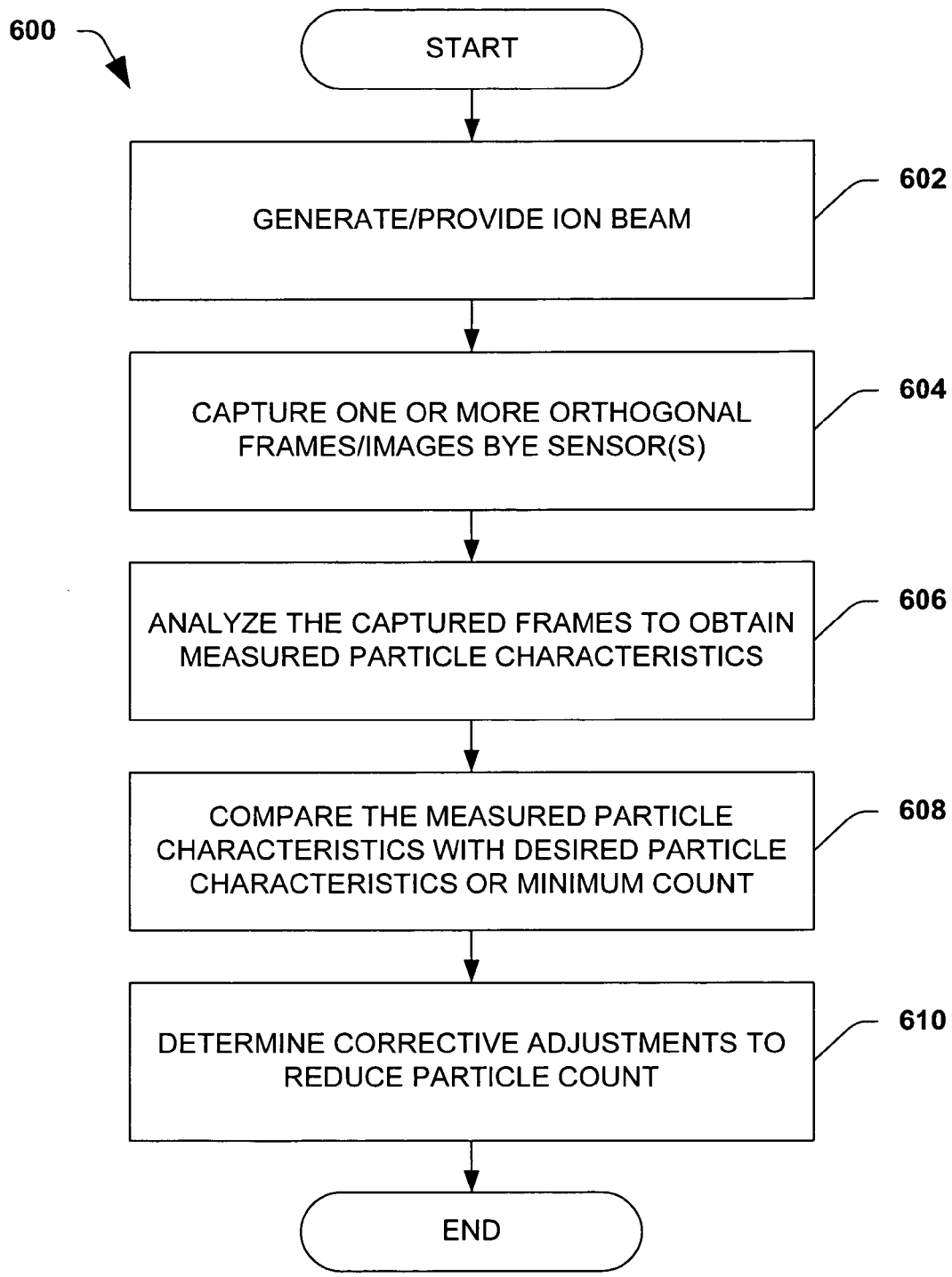
FIG. 6 is a flow diagram of a method of monitoring particles within an ion beam in accordance with an aspect of the present invention.

FIG. 6 is a flow diagram of a method 600 of monitoring particles within an ion beam in accordance with an aspect of the present invention. The method 600 can be performed to obtain particle measurements, such as particle count, velocity, and the like and/or to adjust ion beam generation and/or beam processing in accordance with the obtained particle measurements. The method 600 can be performed as part of a setup process and/or during ion implantation.

The method 600 begins at block 602, wherein an ion beam traveling along a path toward a target location is generated or provided. The beam is generated so as to have a desired shape, energy, and dose. Additionally, the ion beam is expected to have a particle count below a threshold or minimum value.

One or more orthogonal frames or images of the ion beam are captured at block 604. The frames are captured by one or more image sensors positioned along the path of the ion beam. The captured frames have a suitable resolution and frame rate that can vary according to implementation and characteristics being monitored. Examples of suitable frame rates employed are, 30 fps, 60 fps, 1000 fps, and the like. In some examples, higher frame rates can require higher resolutions for the frames in order to suitably monitor the monitored characteristics.

The captured frames are analyzed at block 606 to obtain measured particle characteristics of the ion beam. The measured characteristics can include, for example, particle count, particle velocity, trajectory, and the like.

As stated above, particles are contaminants that enter the ion beam via a number of mechanisms, such as, ions striking photoresist coated surfaces, particles breaking off of components within the system, and the like. The particles can interfere with ion implantation processes and degrade and/or destroy semiconductor devices undergoing ion implantation.

Particles are typically larger than ions within a beam and tend to be brighter than other portions of the beam in which they are present. Thus, to measure particles, in one example, a segment or line of pixels having brightness above a baseline value in a current frame is identified. Identifying segments in such a manner mitigates false identifications from sources, such as surfaces simply reflecting light. This identified segment yields a starting point for a vector representing an identified particle. Subsequent frames can be analyzed for continuation of that particle and to provide trajectory and velocity with respect to identified segments and frame rates. Alternately, all such information can be obtained from a single frame. Information about each identified particle can comprise the trajectory, speed/velocity, size, and the like. It is noted that in some aspects of the invention, only a count of particles is obtained.

The particle measurements are compared with desired particle characteristics at block 608. The characteristics can include, for example, minimum particle count, trajectory, and the like.

If the particle measurements differ from the desired-characteristics, such as being greater than a minimum particle count, corrective adjustments are determined at block 610. For example, particle counts above a threshold/minimum amount could result in corrective adjustments such as tuning source parameters within an ion source. As another example, particle counts above a threshold amount could result in adjusting extraction optics used in focusing and shaping the ion beam through a beamline assembly. As another example, reducing the overall size of the ion beam can mitigate particle generation by reducing impact of ions with apertures and the like within the beamline assembly.

It is appreciated that the method 600, as well as variations thereof, can be further appreciated with reference to other figures of the present invention. Additionally, the method 600 and description thereof can also be employed to facilitate a better understanding of other aspects of the invention described above.

While, for purposes of simplicity of explanation, the method 600 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features or blocks may be required to implement a methodology in accordance with an aspect the present invention.

Figure 7:
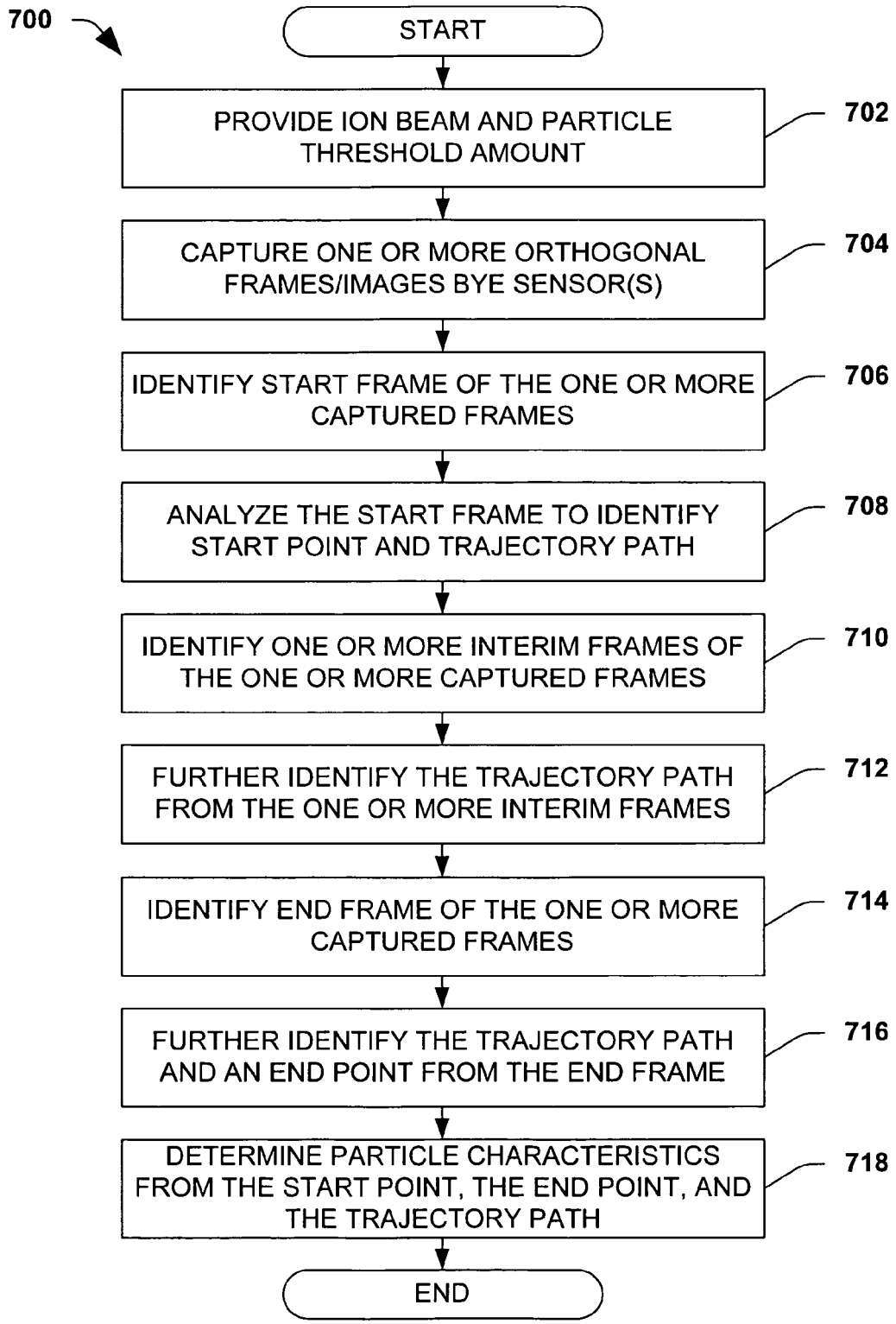
FIG. 7 is a flow diagram illustrating a method of performing image analysis in accordance with an aspect of the present invention.

FIG. 7 is a flow diagram illustrating a method 700 of performing image analysis in accordance with an aspect of the present invention. The method 700 analyzes information from one or more frames to identify particles and determine characteristics of the identified particles. FIGS. 4A to 4F can also be referenced to further illustrate image analysis.

The method 700 begins at block 702, wherein an ion beam is provided. The ion beam has properties or characteristics, such as, beam shape, energy, dose, beam current intensity, dopant type(s), and the like. Additionally, the ion beam can have a minimum or acceptable amount of particles designated or selected for the ion beam.

At block 704, one or more frames are obtained or captured. The frames are captured by an image sensor positioned along the path of the ion beam. In one example, the image sensor is positioned near or proximate a target wafer. The captured frames have a suitable resolution and frame rate that can vary according to implementation and characteristics being monitored. Examples of suitable frame rates employed are, 30 fps, 60 fps, 1000 fps, and the like. In some examples, higher frame rates can require higher resolutions for the frames in order to suitably monitor the monitored characteristics. Additionally, each of the frames has an associated timestamp or other temporal value.

The obtained frames are analyzed to identify a start frame of a particle vector at block 706. The start frame for the particle vector can be identified by having one or more pixels or a segment of pixels that have a higher intensity than a baseline value. For example, first and second frames can have brightness or intensity values that are below a threshold value, toward black. A third frame having a segment of pixels higher than a baseline value result in the third frame being identified as a start frame for the particle vector.

The start frame is analyzed to determine a start point and trajectory path for the particle at block 708. The start point is an initial or starting point of the particle within the start frame.

In one example, the start point is a leftmost point of the identified segment, as shown in FIG. 4A, assuming an ion beam traveling from left to right. The trajectory path is a path, identified as pixels above the baseline value within the start frame, through which the particle has traveled. The trajectory path can also be employed to determine velocity for the particle.

At block 710, one or more interim frames for the particle are identified. These frames, similar to FIG. 4B, indicate subsequent movement of the particle at adjacent frames. The one or more interim frames occur immediately after the start frame. Additionally, it is noted, that in some instances, there are no interim frames identified.

The interim frames are analyzed to further identify the trajectory path of the particle at block 712. The trajectory path typically continues from the start frame through the interim frames.

At block 714, an end frame for the particle is identified. The end frame is the last frame in which the particle can be located or identified. In one example, the end frame can be identified as a last frame with a segment or pixels above a baseline value. For example, if fourth, fifth and sixth frames are identified as having segments or pixels above the baseline value, the fourth and fifth frames can be designated as interim frames and the fifth frame can be identified as an end frame.

The end frame is analyzed at block 716 to identify an end point and to further identify the trajectory path for the particle. For a beam traveling left to right, a right most pixel above a threshold/baseline value can be identified as the end point. The trajectory path of the particle can be completed from the segment or pixels above the baseline value from the end frame.

The particle and associated characteristics are determined at block 718 according to the start point, the end point, the trajectory path, the start frame, the interim frames and the end frame. The associated characteristics include mass or size of the particle, velocity of the particle, a projected target location of the particle, and the like. The mass of the particle can be obtained by identifying the number of pixels above the baseline value. The velocity can be obtained from the start point, the end point, and the time stamp information on the frames. The projected target location can be obtained from that velocity and the trajectory path identified. The projected target location can indicate whether the particle will or will not impact a target device, such as a semiconductor wafer.

It is appreciated that the method 700, as well as variations thereof, can be further appreciated with reference to other figures of the present invention. Additionally, the method 700 and description thereof can also be employed to facilitate a better understanding of other aspects of the invention described above.

Additionally, it is also noted that the image analysis described in the method 700 can, at least in part, be employed for monitoring other characteristics of ion beams, such as beam current intensity, beam current intensity variations, and the like.

While, for purposes of simplicity of explanation, the method 700 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features or blocks may be required to implement a methodology in accordance with an aspect the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

What is claimed is:

1. An ion implantation system comprising:
   an ion source that generates an ion beam;
   a beam line assembly that receives the ion beam from the ion source and through which the ion beam passes;
   an imaging monitor system that captures frames of the ion beam at one or more points along a path of the ion beam and analyzes the captured frames to measure one or more characteristics of the ion beam; and
   a target location that receives the ion beam from the beam line assembly.

2. The system of claim 1, further comprising an end station located downstream of the beam line assembly, that holds a target workpiece at the target location.

3. The system of claim 2, wherein the end station further comprises a process disk onto which multiple target workpieces are held and pass through the target location.

4. The system of claim 2, wherein the end station is a single workpiece end station.

5. The system of claim 1, wherein the imaging monitor system comprises an image sensor located proximate to the target location.

6. The system of claim 1, wherein the imaging monitor system comprises an image sensor positioned within the beam line assembly or with a view of the interior of the beamline assembly through which the beam passes.

7. The system of claim 1, wherein the imaging monitor system comprises a plurality of sensors.

8. The system of claim 1, wherein the measured characteristics comprise at least one from the group consisting of particle count, particle characteristics, beam intensity, beam intensity variations, and size and shape of the ion beam.

9. The system of claim 1, wherein the imaging monitor system comprises one or more image sensors that capture the frames, an image analyzer that analyzes the frames to measure the one or more characteristics, and a controller that generates feedback for the beam line assembly and the ion source.

10. The system of claim 1, wherein the imaging monitor system provides feedback to the beam line assembly according to the measured characteristics.

11. The system of claim 1, wherein the imaging monitor system provides feedback to the ion source according to the measured characteristics.

12. An imaging monitor system comprising:
   one or more image sensors positioned along a path of an ion beam that capture frames of the ion beam;
   an image analyzer that receives the captured frames from the one or more image sensors and analyzes the captured frames to measure one or more characteristics of the ion beam; and
   a controller that receives the measured characteristics from the image analyzer and determines corrective adjustments according to the measured characteristics.

13. The system of claim 12, further comprising an ion implantation system that generates the ion beam and receives the corrective adjustments.

14. The system of claim 12, wherein the one or more image sensors operate at a selected frame rate and resolution.

15. The system of claim 14, wherein the selected frame rate is at least 30 fps and the selected resolution is 640 pixels by 480 pixels.

16. The system of claim 12, wherein the measured characteristics include a particle count.

17. The system of claim 12, wherein the measured characteristics include beam intensity and beam shape.

18. The system of claim 12, wherein the image analyzer determines particle vectors for identified particles that include velocity and trajectory.

19. A method of monitoring characteristics of an ion beam comprising:
   providing an ion beam traveling along a beam path toward a target location;
   capturing one or more orthogonal frames or images of the ion beam along the beam path; and
   analyzing the captured frames to obtain measured characteristics of the ion beam.

20. The method of claim 19, further comprising comparing the measured characteristics with desired beam characteristics.

21. The method of claim 20, further comprising determining adjustments for beam generation according to the measured characteristics and the desired beam characteristics.

22. The method of claim 19, wherein analyzing the captured frames to obtain the measured characteristics includes obtaining particle count, beam intensity beam intensity variations, and beam shape.

23. A method for performing image analysis comprising:
   obtaining one or more frames along a path of an ion beam;
   analyzing the obtained frames to identify a start frame for a particle;
   determining a start point and trajectory path for the particle;
   analyzing the obtained frames to identify interim frames;
   further determining the trajectory path according to the identified interim frames;
   analyzing the obtained frames to identify an end frame for the particle;
   further determining the trajectory path according to the identified end frame; and
   determining an end point for the particle according to the identified end frame.

24. The method of claim 23, further comprising determining a mass for the particle from the start frame.

25. The method of claim 23, further comprising determining a velocity according to the trajectory path, the start point, and the end point.

26. The method of claim 25, further comprising determining a projected target location according to the velocity and the trajectory path.

27. The method of claim 23, wherein the start frame is identified as a first frame having a segment of pixels with an intensity above a baseline value.

* * * * *